United States Patent
Fujiwara et al.

(10) Patent No.: US 7,359,822 B2
(45) Date of Patent: Apr. 15, 2008

(54) TESTING DEVICE

(75) Inventors: Yuichi Fujiwara, Tokyo (JP); Shinya Sato, Tokyo (JP)

(73) Assignee: Advantest Corporation, Tokyo (JP)

( * ) Notice: Subject to any disclaimer, the term of this patent is extended or adjusted under 35 U.S.C. 154(b) by 286 days.

(21) Appl. No.: 11/196,020

(22) Filed: Aug. 3, 2005

(65) Prior Publication Data

US 2005/0278599 A1 Dec. 15, 2005

Related U.S. Application Data

(63) Continuation of application No. PCT/JP2004/001115, filed on Feb. 4, 2004.

(30) Foreign Application Priority Data

Feb. 4, 2003 (JP) .............................. 2003-026912

(51) Int. Cl.
*G06F 19/00* (2006.01)

(52) U.S. Cl. ...................... 702/120; 324/73.1; 324/537; 324/763; 702/108; 702/117; 702/118; 702/119; 702/124; 702/186; 714/724; 714/738; 714/742

(58) Field of Classification Search ............... 324/73.1, 324/537, 763; 702/108, 117, 118, 119, 120, 702/124, 182, 183, 186, 187; 712/6, 7; 714/718, 714/724, 738, 742
See application file for complete search history.

(56) References Cited

U.S. PATENT DOCUMENTS 3,082,374 A * 3/1963 Buuck ........................ 324/73.1

(Continued)

FOREIGN PATENT DOCUMENTS

EP 0 510 679 A2 * 10/1992

(Continued)

OTHER PUBLICATIONS

IBM Technical Disclosure Bulletin: "Advanced Communication Test System", Nov. 1, 1981, IBM Technical Disclosure Bulletin vol. No. 24, Issue No. 6, pp. 2918-2920.*

(Continued)

*Primary Examiner*—Edward R Cosimano
(74) *Attorney, Agent, or Firm*—Osha•Liang LLP (57) ABSTRACT

A testing device that tests an electronic device includes a test pattern outputting unit operable to output a test pattern to the electronic device, a deciding unit operable to decide whether an output signal from the electronic device satisfies a predetermined condition, an instruction storing unit operable to store a plurality of instruction codes, a first instruction pipeline operable to generate a condition satisfaction instruction stream including a plurality of instructions that causes the test pattern outputting unit to output the test pattern to be supplied to the electronic device when the output signal satisfies the condition based on the plurality of instruction codes, a second instruction pipeline operable to generate a condition non-satisfaction instruction stream including a plurality of instructions that causes the test pattern outputting unit to output the test pattern to be supplied to the electronic device when the output signal does not satisfy the condition based on the plurality of instruction codes, and a selection unit operable to select which of the condition satisfaction instruction stream or the condition non-satisfaction instruction stream is supplied to the test pattern outputting unit based on the result decided by the deciding unit.

10 Claims, 9 Drawing Sheets

U.S. PATENT DOCUMENTS

| | | | | |
|---|---|---|---|---|
| 3,546,582 A | * | 12/1970 | Barnard et al. | 714/724 |
| 3,648,175 A | * | 3/1972 | Barnard et al. | 324/115 |
| 3,916,306 A | * | 10/1975 | Patti | 714/745 |
| 5,511,162 A | * | 4/1996 | Hamada et al. | 714/26 |
| 6,078,189 A | * | 6/2000 | Noel | 324/765 |
| 6,327,686 B1 | * | 12/2001 | Grundmann et al. | 714/738 |
| 6,836,856 B2 | * | 12/2004 | Blanton | 714/25 |
| 6,975,956 B2 | * | 12/2005 | Chang et al. | 702/120 |
| 7,058,865 B2 | * | 6/2006 | Mori et al. | 714/724 |
| 2002/0178399 A1 | * | 11/2002 | Blanton | 714/25 |
| 2004/0059536 A1 | * | 3/2004 | Chang et al. | 702/120 |
| 2004/0177302 A1 | * | 9/2004 | Mori et al. | 714/738 |
| 2005/0268196 A1 | * | 12/2005 | Chang et al. | 714/742 |
| 2005/0278599 A1 | * | 12/2005 | Fujiwara et al. | 714/742 |

FOREIGN PATENT DOCUMENTS

| | | | |
|---|---|---|---|
| JP | 62-185177 | | 8/1987 |
| JP | 7-73700 A | * | 3/1995 |
| JP | 7-191097 | | 7/1995 |
| JP | 8-62301 | | 3/1996 |
| JP | 8-62303 | | 3/1996 |
| JP | 11-83951 | | 3/1999 |
| JP | 11-237451 | | 8/1999 |

OTHER PUBLICATIONS

International Search Report for PCT/JP2004/001115 mailed on Jun. 1, 2004, 2 pages.

* cited by examiner

```
START
        NOP         · · · #0
        NOP         · · · #1
AA:     NOP         · · · #2
        NOP         · · · #3
        NOP         · · · #4
        FLGLI AA:   · · · #5
        NOP         · · · #6
        NOP         · · · #7
        NOP         · · · #8
BB:     NOP         · · · #9
        NOP         · · · #A
        NOP         · · · #B
        FLGLI BB:   · · · #C
        NOP         · · · #D
        NOP         · · · #E
        STPS        · · · #F
```

TESTING DEVICE

CROSS REFERENCE TO THE RELATED APPLICATION

The present application is a continuation application of PCT/JP04/001115 filed on Feb. 4, 2004, which claims priority from a Japanese Patent application No. 2003-026912 filed on Feb. 4, 2003, the entire contents of which are incorporated herein by reference for all purposes.

BACKGROUND OF THE INVENTION

1. Field of the Invention

The present invention relates to a testing device. More particularly, the present invention relates to a testing device that tests an electronic device.

2. Description of Related Art

Conventionally, a testing device that performs a match detection task detecting a correspondence between an output signal from an electronic device and an expected value is known as disclosed, for example, in Japanese Patent Laid-Open No. 1995-73700, particularly pages 2 and 3, and FIGS. 1 to 4 thereof. The testing device detects, e.g., a completion of writing and erasing of a flash memory by the match detection task.

In the testing device, a pattern generator generating a test pattern uses an instruction pipeline that sequentially prefetches and processes instruction codes. The pattern generator outputs the test pattern based on an output of the instruction pipeline.

However, for example, when changing the test pattern according to the result of the match detection mask, it is necessary to destroy an instruction stream stored in the instruction pipeline to generate a new instruction stream, in some cases. In this case, since the instruction pipeline is repacked in order to generate a new instruction stream, there has been a problem that testing time increases.

Here, in order for a pattern generator to adequately output a test pattern varying at high speed, for example, an instruction pipeline having the number of stages of about 100 stages is used in some cases. In this case, repacking the instruction pipeline needs, e.g., time of about several milliseconds or more. Moreover, since a match test is frequently used, e.g., in case of testing a flash memory, etc., a test cost increases due to time required for repacking the instruction pipeline.

SUMMARY OF THE INVENTION

Therefore, it is an object of the present invention to provide a testing device that can solve the foregoing problems. The above and other objects can be achieved by combinations described in the independent claims. The dependent claims define further advantageous and exemplary combinations of the present invention.

To achieve this object, according to the first aspect of the present invention, there is provided a testing device that tests an electronic device. The testing device includes: a test pattern outputting unit operable to output a test pattern to the electronic device; a deciding unit operable to decide whether an output signal from the electronic device satisfies a predetermined condition; an instruction storing unit operable to store a plurality of instruction codes to be used for a test of the electronic device; a first instruction pipeline operable to generate a condition satisfaction instruction stream including a plurality of instructions that causes the test pattern outputting unit to output the test pattern to be supplied to the electronic device when the output signal satisfies the condition based on the plurality of instruction codes sequentially received from the instruction storing unit; a second instruction pipeline operable to generate a condition non-satisfaction instruction stream including a plurality of instructions that causes the test pattern outputting unit to output the test pattern to be supplied to the electronic device when the output signal does not satisfy the condition based on the plurality of instruction codes sequentially received from the instruction storing unit; and a selection unit operable to select which of the condition satisfaction instruction stream or the condition non-satisfaction instruction stream is supplied to the test pattern outputting unit based on the result decided by the deciding unit.

Moreover, the deciding unit may decide that the output signal satisfies the condition when the output signal is identical with a predetermined value.

Moreover, the electronic device may a semiconductor memory, the test pattern outputting unit may output the test pattern performing writing or erasing with respect to a preset address of the semiconductor memory, the deciding unit may decide that the output signal satisfies the condition when the semiconductor memory outputs the output signal showing a completion of the writing or erasing, the second instruction pipeline may generate an instruction stream, which causes the test pattern outputting unit to output the test pattern performing the writing or erasing once more with respect to the preset address, as the condition non-satisfaction instruction stream, and the selection unit may cause the second instruction pipeline to output the condition non-satisfaction instruction stream in order to make the test pattern outputting unit perform the writing or erasing once more with respect to the preset address when the deciding unit decides that the output signal does not satisfy the condition.

Moreover, the first instruction pipeline may generate an instruction stream, which causes the test pattern outputting unit to output the test pattern performing writing or erasing with respect to an address different from the preset address of the semiconductor memory, as the condition satisfaction instruction stream.

Moreover, the testing device may test the plurality of semiconductor memories, and the deciding unit may decide that the output signal satisfies the condition when all the semiconductor memories output the output signal showing a completion of the writing or erasing. Moreover, the semiconductor memory may be a flash memory.

Moreover, when the output signal does not satisfy the condition, the second instruction pipeline may further generate a new condition satisfaction instruction stream after supplying the condition non-satisfaction instruction stream to the test pattern outputting unit, the first instruction pipeline may destroy the condition satisfaction instruction stream to newly generate a condition non-satisfaction instruction stream, the deciding unit may decide again whether the output signal satisfies the condition after the second instruction pipeline generates the condition satisfaction instruction stream, and the selection unit may select again which of the condition satisfaction instruction stream or the condition non-satisfaction instruction stream is supplied to the test pattern outputting unit based on the result decided by the deciding unit.

Moreover, the instruction storing unit may store a flag code that is the instruction code in association with a preset jump flag and a conditional jump code that is the instruction code causing the deciding unit to decide whether the output signal from the electronic device satisfies the condition and causing the test pattern outputting unit to execute the instruction corresponding to the flag code when the output signal does not satisfy the condition, the second instruction pipeline may generate instructions respectively corresponding to the flag code and the conditional jump code as the instructions at the head and end of the condition non-satisfaction instruction stream, and the deciding unit may perform the decision of the condition according to the conditional jump code.

Moreover, the second instruction pipeline may store a storage instruction stream including the instructions of a predetermined number generated by processing the plurality of instruction codes, sequentially update the storage instruction stream based on the instruction codes sequentially output from the instruction storing unit, and hold at least a part of the storage instruction stream as the condition non-satisfaction instruction stream by stopping receiving the instruction codes when the instruction at the head of the updated storage instruction stream is the instruction corresponding to the flag code.

Moreover, the testing device may further include an instruction supplying unit operable to supply the instruction codes sequentially received from the instruction storing unit to both of the first instruction pipeline and the second instruction pipeline while the second instruction pipeline is receiving the instruction codes and also supply the instruction codes to the first instruction pipeline after the second instruction pipeline stops receiving the instruction codes.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
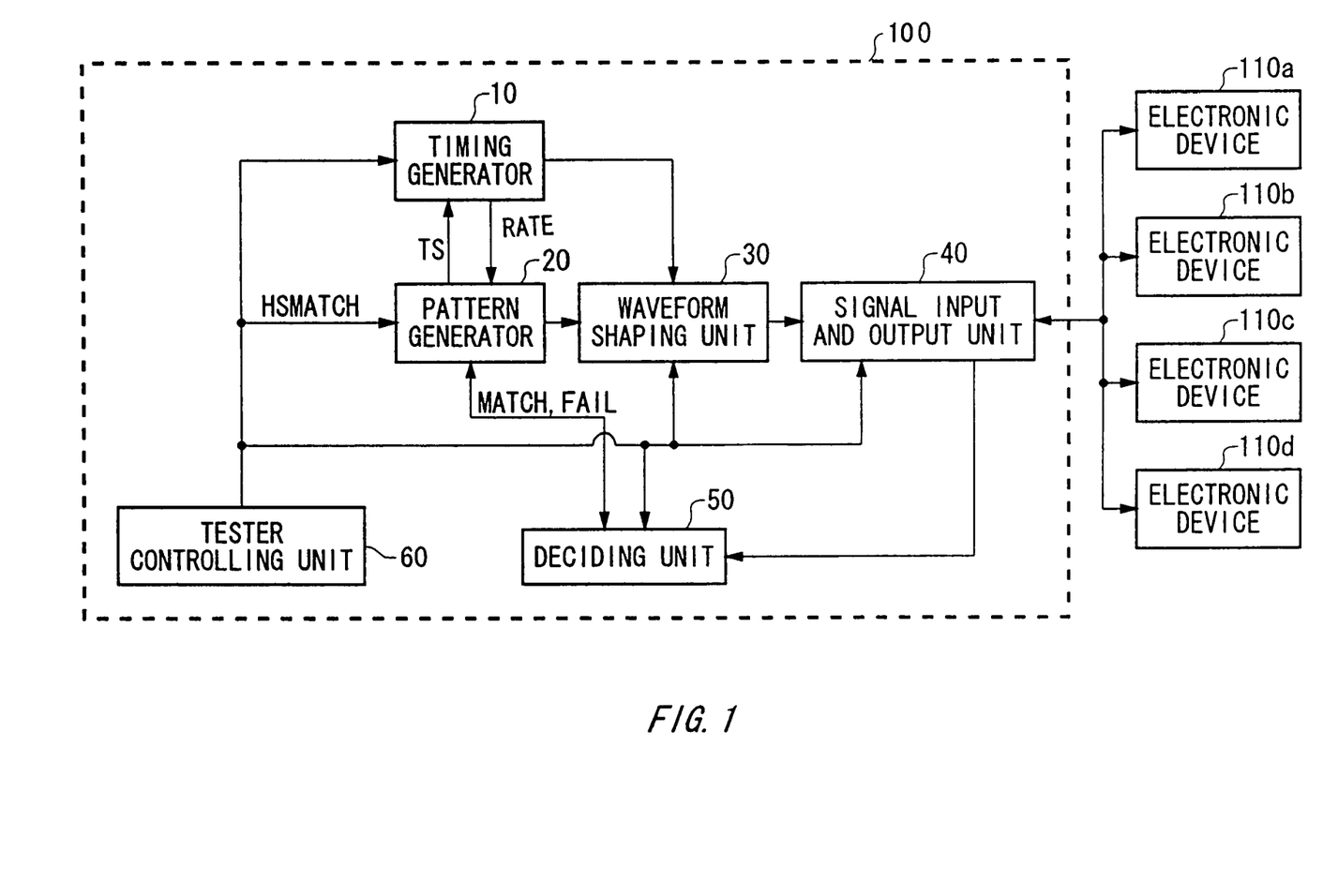
FIG. 1 is a view exemplary showing a configuration of a testing device according to an embodiment of the present invention.

FIG. 1 is a view exemplary showing a configuration of a testing device 100 according to an embodiment of the present invention. The testing device 100 of this example can test a plurality of electronic devices 110a to 110d at high speed by efficiently conducting a conditional branch according to a match detection task. The testing device 100 includes a timing generator 10, a pattern generator 20, a waveform shaping unit 30, a signal input and output unit 40, a deciding unit 50, and a tester controlling unit 60.

The timing generator 10 generates a cycle clock RATE of a predetermined cycle to supply the cycle clock to the pattern generator 20 based on timing data designated by a timing set signal TS received from the pattern generator 20. Moreover, the timing generator 10 further generates a delay clock corresponding to the cycle clock RATE to supply the delay clock to the waveform shaping unit 30.

The pattern generator 20 supplies the timing set signal TS to the timing generator 10 to receive the cycle clock RATE corresponding to the timing set signal TS from the timing generator 10. Then, the timing generator 10 outputs a preset test pattern based on the cycle clock RATE. Moreover, the pattern generator 20 further supplies an expected value of an output signal of the plurality of electronic devices 110a to 110d to the deciding unit 50.

The waveform shaping unit 30 shapes a waveform of a test pattern received from the pattern generator 20 to supply a test signal to be supplied to the plurality of electronic devices 110a to 110d to the signal input and output unit 40 based on the delay clock received from the timing generator 10. The signal input and output unit 40 supplies the test signal received from the waveform shaping unit 30a to the plurality of electronic devices 110a to 110d. Moreover, the signal input and output unit 40 supplies an output signal output from each of the plurality of electronic devices 110a to 110d according to the test signal to the deciding unit 50.

The deciding unit 50 decides whether the output signals from the plurality of electronic devices 110a to 110d satisfy a predetermined condition. Here, in this example, the testing device 100 performs a match test. When performing the match test, the deciding unit 50 receives a predetermined expected value corresponding to the output signal from the pattern generator 20, and decides that the output signal satisfies the condition when the output signal is identical with the expected value.

Then, the deciding unit 50 supplies a match signal MATCH showing presence or absence of the correspondence to the pattern generator 20 based on the decision result. Moreover, when the correspondence is not detected, the deciding unit 50 receives the output signals from the plurality of electronic devices 110a to 110d once more, and decides once more whether the output signals are identical with the expected value after the pattern generator 20 outputs a predetermined test pattern. Then, when the decision results show a mismatch more than a preset prescribed number of times, the deciding unit 50 outputs a fail signal FAIL showing the excess of the prescribed number of times to the pattern generator 20.

The tester controlling unit 60 controls the timing generator 10, the pattern generator 20, the waveform shaping unit 30, the signal input and output unit 40, and the deciding unit 50. In this example, the tester controlling unit 60 supplies, e.g., a match test instructing signal HSMATCH to the pattern generator 20 to make the testing device 100 execute a match test. According to this example, it is possible to adequately test the plurality of electronic devices 110a and 110b.

In addition, in this example, the plurality of electronic devices 110a to 110d is a flash memory that is an example of a semiconductor memory. Each of the plurality of electronic devices 110a to 110d performs writing or erasing according to a test signal received from the testing device 100. Then, when the writing or erasing has been completed in each of the electronic devices 110, each of the electronic devices 110a to 110d hereinafter electronic devices 110, outputs an output signal showing a completion of the writing or erasing. Then, when all electronic devices 110a to 110d output the output signal showing a completion of the writing or erasing, the deciding unit 50 decides that the output signals from the electronic devices 110 satisfy the condition.

Moreover, in this example, the testing device 100 is a shared tester that supplies a test signal to the plurality of electronic devices 110a to 110d at the same time. In another example, the testing device 100 may be an independent tester that supplies a test signal independent of one another to each of the plurality of electronic devices 110a to 110d.

Figure 2:
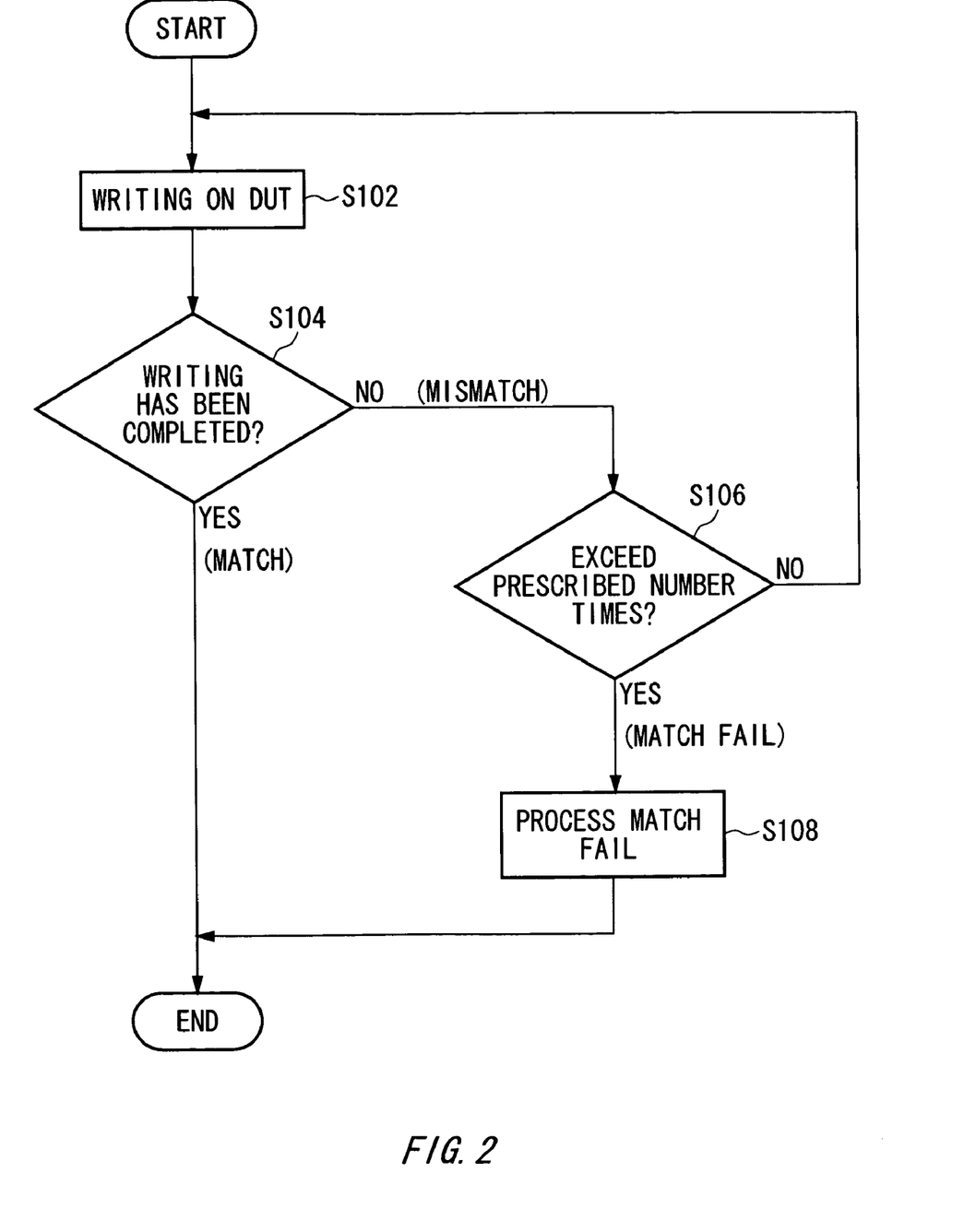
FIG. 2 is a flowchart exemplary showing an operation of the testing device.

FIG. 2 is a flowchart exemplary showing an operation of the testing device 100 when performing the match test. At first, the pattern generator 20 outputs a test pattern for performing writing on a preset address of the electronic device 110 that is a DUT (device under test), and the waveform shaping unit 30 outputs a test signal corresponding to the test pattern to perform the writing on the electronic device 110 (S102).

Next, the deciding unit 50 performs a match detection task for deciding whether an output signal from the electronic device 110 is identical with an expected value (S104). Then, when the output signal is identical with the expected value (match), the deciding unit 50 decides that the writing has been completed and terminates this match test. Next, the testing device 100 starts writing, e.g., on a next address of the electronic device 110.

In S104, when the output signal is not identical with the expected value (mismatch), the deciding unit 50 decides that the writing has not been completed. Then, when the number of repetitions of the writing already performed is within a prescribed number of times (S106), the process returns to S102 to perform the writing on the same address of the electronic device 110 once more.

On the other hand, when the number of repetitions exceeds the prescribed number of times (S106), the deciding unit 50 decides that the writing has failed (match fail). In this case, the testing device 100 performs the match fail process on a faulty point in the electronic device 110 (S108) to terminate the operation. In addition, the testing device 100 may start writing on, e.g., a next address of the electronic device 110 after the match fail process.

According to this example, it is possible to adequately test the electronic device 110 that is a flash memory. In addition, the deciding unit 50 outputs, e.g., a match signal MATCH in S104 and a fail signal FAIL in S108. Moreover, the electronic device 110 may perform the similar match test by performing erasing in place of writing on the electronic device 110.

Figure 3:
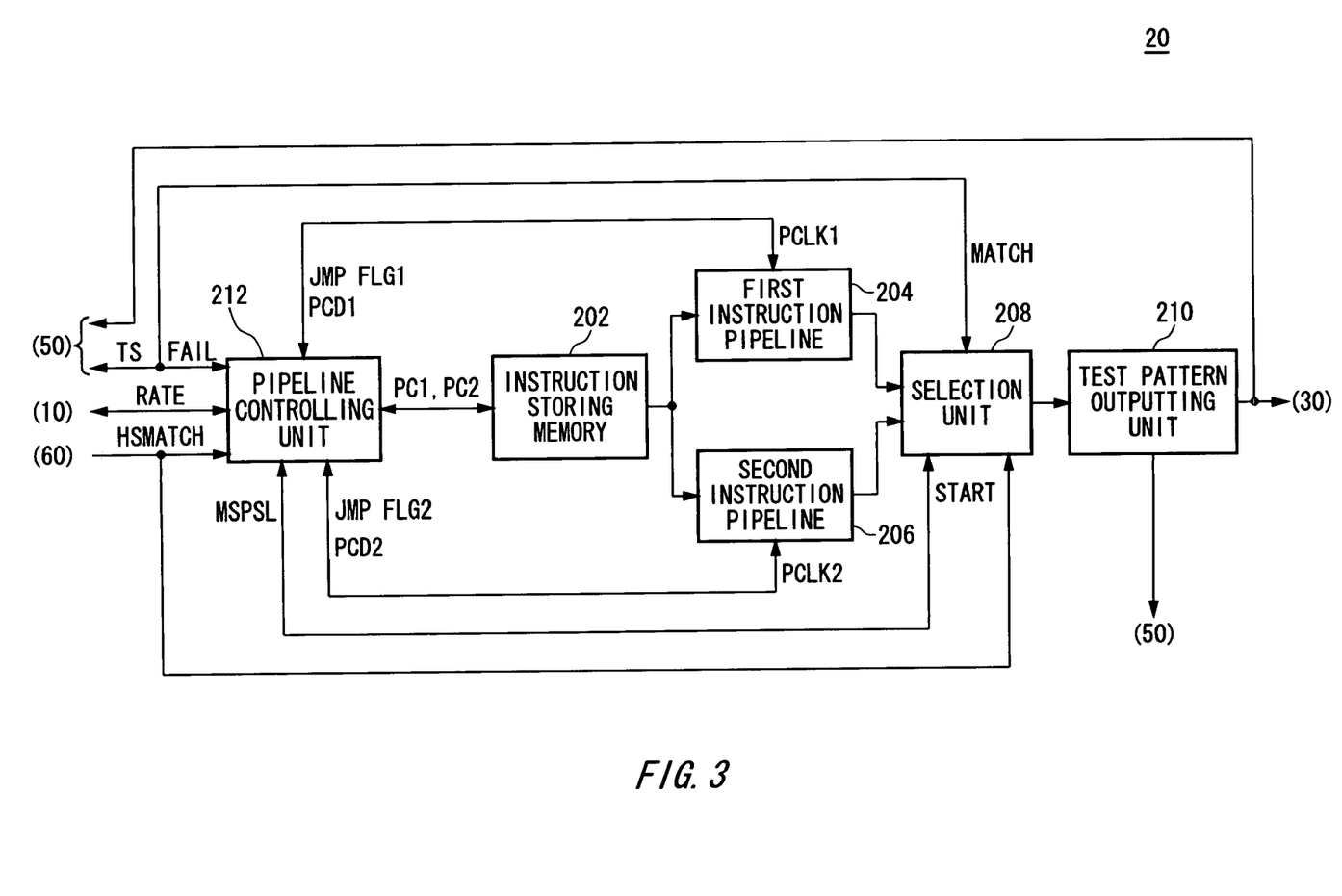
FIG. 3 is a view exemplary showing a configuration of a pattern generator.

FIG. 3 is a view exemplary showing a configuration of the pattern generator 20. The pattern generator 20 has an instruction storing memory 202, a pipeline controlling unit 212, a first instruction pipeline 204, a second instruction pipeline 206, a selection unit 208, and a test pattern outputting unit 210.

The instruction storing memory 202 is an example of an instruction storing unit that stores a plurality of instruction codes to be used for a test of the electronic device 110 (see FIG. 1). The instruction storing memory 202 stores a plurality of instruction codes included in a preset program.

The pipeline controlling unit 212 is an example of an instruction supplying Unit that supplies the plurality of instruction codes stored on the instruction storing memory 202 to each of the first instruction pipeline 204 and the second instruction pipeline 206. The pipeline controlling unit 212 sequentially changes program counter values PC1 and PC2 showing addresses of the instruction storing memory 202 on which the instruction codes are stored according to the cycle clock RATE received from the timing generator 10 in order to cause the instruction storing memory 202 to supply the instruction code corresponding to each of the program counter values PC1 and PC2 to each of the first instruction pipeline 204 and the second instruction pipeline 206.

Moreover, the pipeline controlling unit 212 outputs the program counter values PC1 and PC2 based on information received from the first instruction pipeline 204, the second instruction pipeline 206, the deciding unit 50, and the tester controlling unit 60. In addition, in this example, the pipeline controlling unit 212 supplies the timing set signal TS to the timing generator 10. Moreover, the pipeline controlling unit 212 supplies each of pipeline clocks PCLK1 and PCLK2 to each of the first instruction pipeline 204 and the second instruction pipeline 206.

The first instruction pipeline 204 and the second instruction pipeline 206 sequentially process the plurality of instruction codes sequentially received from the instruction storing memory 202 according to the pipeline clocks PCLK1 and PCLK2 in order to respectively generate an instruction stream including a plurality of instructions to be supplied to the test pattern outputting unit 210. The first instruction pipeline 204 and the second instruction pipeline 206 supply the generated instruction stream to the pattern outputting unit 210 via the selection unit 208 in order to cause the test pattern outputting unit 210 to output the test pattern to be supplied to the electronic device 110.

For example, the first instruction pipeline 204 generates a condition satisfaction instruction stream that is an instruction stream to be supplied to the test pattern outputting unit 210 when the decision result by the deciding unit 50 is a match. Moreover, the second instruction pipeline 206 generates a condition non-satisfaction instruction stream that is an instruction stream to be supplied to the test pattern outputting unit 210 when the decision result is a mismatch.

In addition, the first instruction pipeline 204 and the second instruction pipeline 206 may respectively generate the condition non-satisfaction instruction stream and the condition satisfaction instruction stream. Moreover, the first instruction pipeline 204 and the second instruction pipeline 206 supply information to identify an instruction code corresponding to the head instruction in the storage instruction stream to the pipeline controlling unit 212.

The selection unit 208 selects one and the other of the first instruction pipeline 204 or the second instruction pipeline 206 as a main pipeline and a sub pipeline based on the match signal MATCH and the match test instructing signal HSMATCH that are respectively received from the deciding unit 50 and the tester controlling unit 60, and supplies an instruction stream received from the main pipeline to the test pattern outputting unit 210. In this way, the selection unit 208 selects which of the condition satisfaction instruction stream or the condition non-satisfaction instruction stream is supplied to the test pattern outputting unit 210.

In addition, the selection unit 208 generates a selection signal MSPSL showing which of the first instruction pipeline 204 or the second instruction pipeline 206 is selected as the main pipeline based on the match signal MATCH and the match test instructing signal HSMATCH in order to supply the signal to the pipeline controlling unit 212. The selection unit 208 may include, e.g., a toggle flip-flop (not shown). The toggle flip-flop respectively receives the outputs from the first instruction pipeline 204 and the second instruction pipeline 206, e.g., via two data inputs, and outputs a signal received via either of the data inputs according to the selection signal MSPSL received via the selected input.

Moreover, the selection unit 208 starts an operation according to a start signal START received from the pipeline controlling unit 212. In this way, the selection unit 208 adequately operates in synchronization with the pipeline controlling unit 212.

The test pattern outputting unit 210 generates a test pattern based on the instruction stream received from the main pipeline via the selection unit 208 to output the pattern to the waveform shaping unit 30. In this way, the test pattern outputting unit 210 outputs the test pattern to the electronic device 110.

Moreover, the test pattern outputting unit 210 supplies the expected value of the output signal from the electronic device 110 to the deciding unit 50 in response to the test pattern. Furthermore, the test pattern outputting unit 210 causes the deciding unit 50 to perform a match detection task according to a predetermined instruction in the received instruction stream.

In this example, the test pattern outputting unit 210 outputs the test pattern that is written or erased on a preset address of the electronic device 110 prior to the match detection task. Then, when receiving the condition satisfaction instruction stream, the test pattern outputting unit 210 performs writing or erasing on an address different from the preset address of the electronic device 110. On the other hand, when receiving the condition non-satisfaction instruction stream, the test pattern outputting unit 210 performs the writing or erasing on the preset address once more.

According to this example, the test pattern outputting unit 210 can immediately change the test pattern to be output according to the result of the match test. Moreover, in this way, it is possible to reduce testing time of the electronic device 110.

Figure 4A:
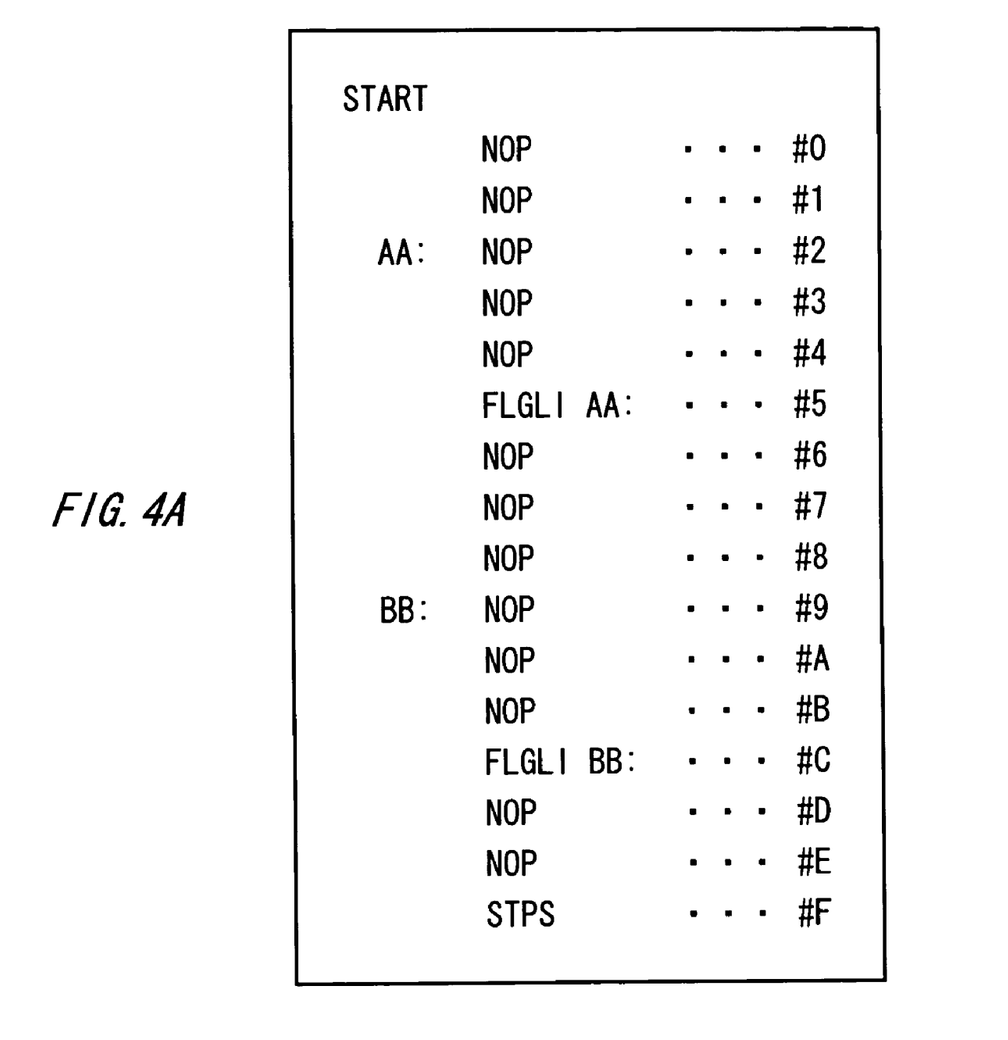
FIG. 4A is a plurality of instruction codes exemplary included in a program stored on an instruction storing memory.
Figure 4B:
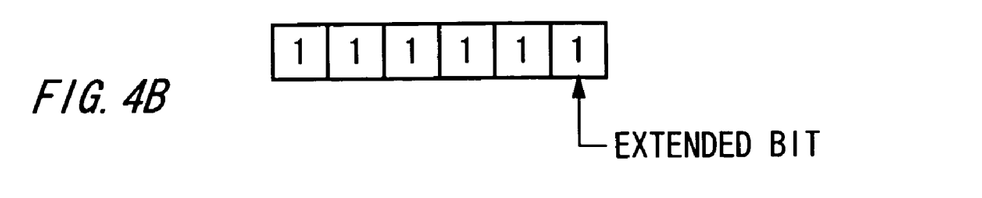
FIG. 4B is a flag code exemplary.

FIGS. 4A and 4B are views exemplary showing a program stored on the instruction storing memory 202. FIG. 4A is a view exemplary showing a plurality of instruction codes included in this program. The instruction storing memory 202 stores a plurality of instructions in association with each of line numbers #0 to #15. In this case, the pipeline controlling unit 212 may output the values corresponding to the line numbers of the program stored on the instruction storing memory 202 as the program counter values PC1 and PC2.

In this example, the instruction storing memory 202 stores a flag code that is an instruction code corresponding to the preset jump flag AA on the line number #2. Moreover, the instruction storing memory 202 stores a conditional jump code corresponding to the jump flag AA on the line number #5.

Here, the conditional jump code on #5 makes the deciding unit 50 perform the match detection task, and in the case of mismatch, is an instruction code by which an execution object is moved to a flag code on the line number #2 of the designated jump flag AA. The deciding unit 50 decides whether the output signal from the electronic device 110 satisfies the predetermined condition according to this conditional jump code (match detection). Then, when the output signal does not satisfy the condition (mismatch), the test pattern outputting unit 210 carries out an instruction corresponding to the designated flag code.

For example, when the decision result by the deciding unit 50 is mismatch, the testing device 100 repeatedly outputs test signals corresponding to instruction codes of the plurality of line numbers #2 to #5. In this case, as described by means of FIG. 2, the testing device 100 repeats the writing on the same address of the electronic device 110.

Moreover, when the decision result by the deciding unit 50 is match, the testing device 100 outputs test signals corresponding to instruction codes below the line number #6, e.g., to start the writing on the next addresses of the electronic device 110.

In addition, the instruction storing memory 202 further stores a flag code corresponding to the jump flag BB on the line number #9 and stores a conditional jump code corresponding to this flag code on the #12. The testing device 100 performs the writing on the next address of the electronic device 110, e.g., in correspondence with the instruction codes of the plurality of line numbers #9 to #12.

Moreover, the instruction storing memory 202 stores an end code STPS showing the end line of this program on the line number 15. The instruction storing memory 202 stores no-operation codes on the other lines.

FIG. 4B is a view exemplary showing a flag code. In this example, the instruction storing memory 202 stores an instruction code of which a predetermined extended bit is set to a predetermined value as a flag code to be used for a match test. In this way, the instruction storing memory 202 can store a flag code to be used for a match test in distinction from a flag code to be used for another application. In addition, bits besides the extended bit in the flag code show that, e.g., the instruction code is a flag code.

Figure 5:
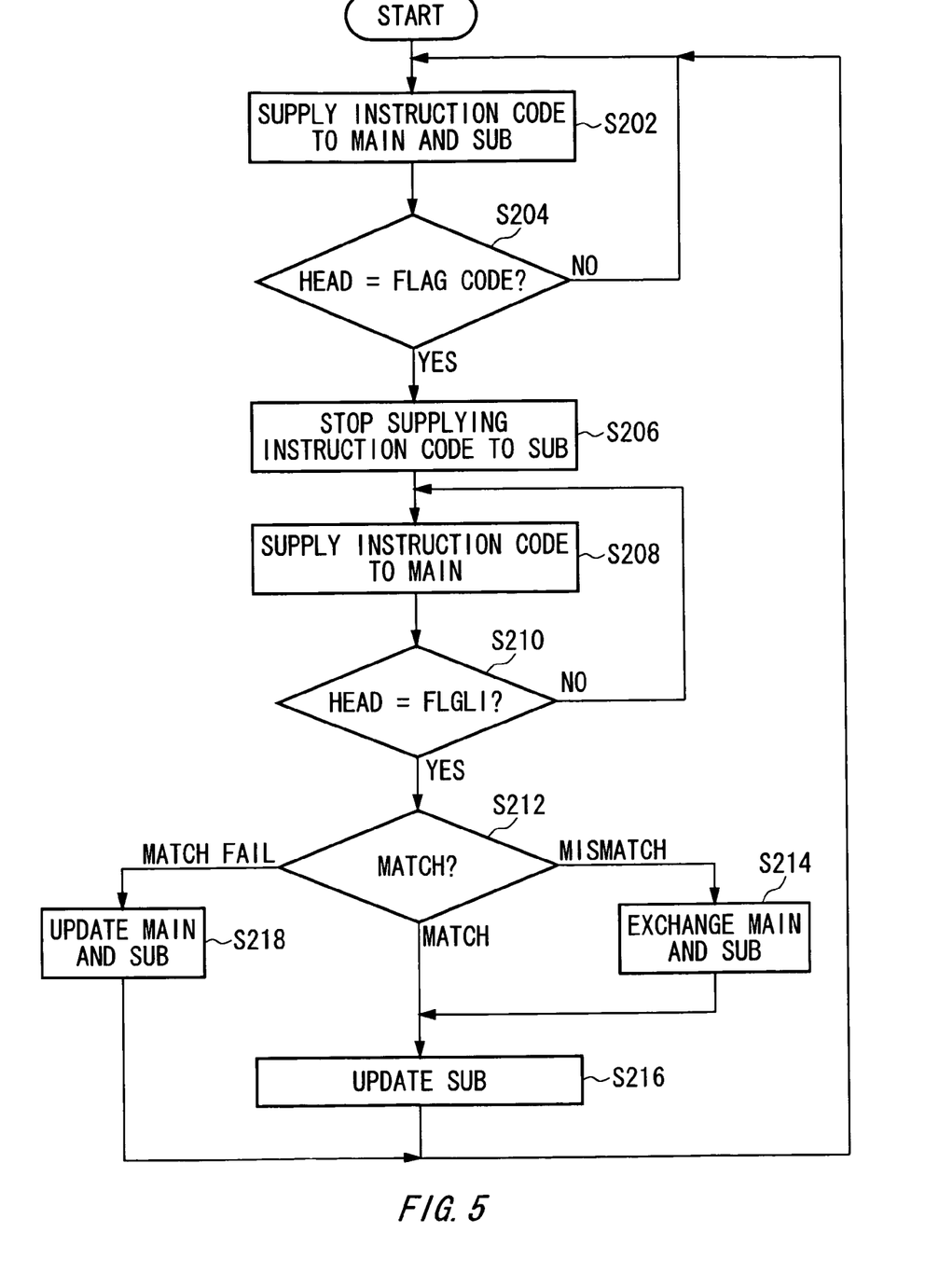
FIG. 5 is a flowchart exemplary showing an operation of the pattern generator.

FIG. 5 is a flowchart exemplary showing an operation of the pattern generator 20. In this example, the selection unit 208 selects the first instruction pipeline 204 as a main pipeline and the second instruction pipeline 206 as a sub pipeline Moreover, the first instruction pipeline 204 and the second instruction pipeline 206 respectively store a storage instruction stream including the instructions of a predetermined number that are generated by processing the plurality of instruction codes.

At first, the pipeline controlling unit 212 provides the program counter values PC1 and PC2 to the instruction storing memory 202 in order to supply the instruction codes corresponding to the program counter values PC1 and PC2 to the first instruction pipeline 204 and the second instruction pipeline 206 (S202). The instruction storing memory 202 outputs the same value as the program counter value PC1, e.g., as the program counter value PC2.

Then, when the head instruction in the instruction stream stored in the first instruction pipeline 204 that is a main pipeline is not an instruction corresponding to the flag code (S204), the process returns to S202. The pipeline controlling unit 212 supplies the next instruction code to the first instruction pipeline 204 and the second instruction pipeline 206. In this way, the first instruction pipeline 204 and the second instruction pipeline 206 sequentially update the storage instruction stream based on the instruction codes sequentially output from the instruction storing memory 202.

On the other hand, in S204, when the head instruction is an instruction corresponding to the flag code, the pipeline controlling unit 212 stops supplying the instruction code to the second instruction pipeline 206 that is a sub pipeline (S206). In other words, the second instruction pipeline 206 stops receiving the instruction code when the head instruction in the updated storage instruction stream is an instruction corresponding to the flag code. In this way, the second instruction pipeline 206 holds at least a part of the storage instruction stream as the condition non-satisfaction instruction stream. It is preferable that the second instruction pipeline 206 stores an instruction stream including the head instruction of the storage instruction stream as the condition non-satisfaction instruction stream.

Here, in this example, the instruction storing memory 202 sequentially outputs the instruction codes in the program described using FIG. 4A from the instruction code of the line number #0. Then, the second instruction pipeline 206 respectively generates instructions corresponding to the flag code of line number #2 and the conditional jump code of line number #5 as the head and end instructions of the condition non-satisfaction instruction stream.

Next to S206, the pipeline controlling unit 212 supplies the next instruction code to the first instruction pipeline 204 (S208). The first instruction pipeline 204 updates the storage instruction stream based on the received instruction code.

In other words, the pipeline controlling unit 212 supplies the instruction codes sequentially output from the instruction storing memory 202 to both of the first instruction pipeline 204 and the second instruction pipeline 206 while the second instruction pipeline 206 is receiving the instruction codes. Moreover, after the second instruction pipeline 206 stops receiving the instruction codes, the pipeline controlling unit 212 supplies the instruction codes to the first instruction pipeline 204.

Then, when the head instruction of the storage instruction stream in the first instruction pipeline 204 is not an instruction corresponding to the conditional jump instruction FLGLI (S210), the process returns to S208. The pipeline controlling unit 212 supplies the next instruction code to the first instruction pipeline 204. In this way, the first instruction pipeline 204 generates the condition satisfaction instruction stream.

On the other hand, in S210, when the head instruction is an instruction corresponding to the conditional jump instruction, the test pattern outputting unit 210 causes the deciding unit 50 to perform the match detection task (S212). Then, when the decision result is a match, the pipeline controlling unit 212 updates the instruction stream stored in the second instruction pipeline 206 to the same instruction stream as the instruction stream stored in the first instruction pipeline 204 (S216).

In this case, the pipeline controlling unit 212 destroys the instruction stream stored in the second instruction pipeline 206, and then sequentially supplies new instruction codes to the second instruction pipeline 206 in order to repack the second instruction pipeline 206. Then, the process returns to S202. The pipeline controlling unit 212 supplies the next instruction code to the first instruction pipeline 204 and the second instruction pipeline 206.

On the other hand, in S212, when the decision result is a mismatch, the selection unit 208 newly selects the second instruction pipeline 206 as a main pipeline and the first instruction pipeline 204 as a sub pipeline to exchange a main pipeline and a sub pipeline with each other (S214). In this case, the pipeline controlling unit 212 updates the instruction stream stored in the first instruction pipeline 204 that is a new sub pipeline to the same instruction stream as the instruction stream stored in the second instruction pipeline 206 (S216), and then the process returns to S202. The first instruction pipeline 204 destroys the condition satisfaction instruction stream in S216, and then newly generates the condition non-satisfaction instruction stream in S202 and S204.

In this case, the selection unit 208 also causes the second instruction pipeline 206 that is a new main pipeline to output the condition non-satisfaction instruction stream. The test pattern outputting unit 210 performs again writing or erasing on a preset address based on the condition non-satisfaction instruction stream. Then, the second instruction pipeline 206 supplies the condition non-satisfaction instruction stream to the test pattern outputting unit 210, and then further generates a new condition satisfaction instruction stream in S208 and S210.

Moreover, after the second instruction pipeline 206 generates the condition satisfaction instruction stream, the deciding unit 50 performs again the match detection task in S212. The selection unit 208 selects again which of the condition satisfaction instruction stream or the condition non-satisfaction instruction stream is supplied to the test pattern outputting unit 210 based on the result of the match detection task.

In addition, when the decision result is a match fail in S212, the pipeline controlling unit 212 destroys the instruction streams stored in the first instruction pipeline 204 and the second instruction pipeline 206 and then sequentially supplies new instructions to the first instruction pipeline 204 and the second instruction pipeline 206 in order to update the instruction streams stored in the first instruction pipeline 204 and the second instruction pipeline 206 (S218). After that, the process returns to S202.

According to this example, although the decision result by the deciding unit 50 is any of a match and a mismatch, a main pipeline that supplies instructions to the test pattern outputting unit 210 is not repacked. Therefore, according to this example, the pattern generator 20 can immediately output the next test pattern according to the result of the match detection task. Moreover, it is possible to perform the match test at high speed.

In addition, in another example, the pattern generator 20 may further have a pipeline that stores an instruction stream to be output when the decision result is a match fail. In this case, it is possible to perform the match test at higher speed.

FIGS. 6A to 6J and FIGS. 7A to 7D are views exemplary explaining an operation of the first instruction pipeline 204 and the second instruction pipeline 206. In FIGS. 6A to 6J and FIGS. 7A to 7D, the upper and lower stages respectively show the storage instruction streams in the first instruction pipeline 204 and the second instruction pipeline 206.

Moreover, in FIGS. 6A to 6J and FIGS. 7A to 7D, it will be described about when the number of pipeline stages is four for convenience of description. The first instruction pipeline 204 and the second instruction pipeline 206 sequentially receive the instruction codes in the program described using FIG. 4A, and thus sequentially are changed like states shown in FIGS. 6A to 6J and FIGS. 7A to 7D.

Figure 6A:
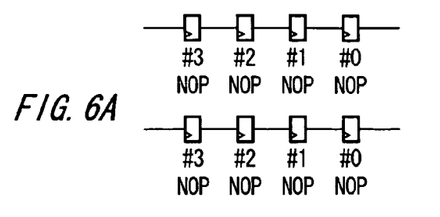
FIGS. 6A to 6J are views exemplary explaining operations of a first instruction pipeline and a second instruction pipeline 206.

At first, the first instruction pipeline 204 and the second instruction pipeline 206 sequentially receive the instruction code from the line number #0 to store an instruction corresponding to the line number #0 as the head instruction as shown in FIG. 6A. In this case, the first instruction pipeline 204 and the second instruction pipeline 206 store the same storage instruction stream. Moreover, the selection unit 208 selects the first instruction pipeline 204 as a main pipeline.

Figure 6B:
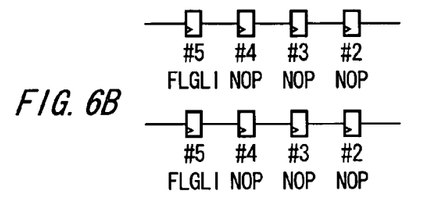

Then, after the first instruction pipeline 204 outputs the instructions corresponding to the line numbers #0 and #1 to the test pattern outputting unit 210, the first instruction pipeline 204 and the second instruction pipeline 206 update the storage instruction stream to an instruction stream including an instruction corresponding to the flag code of the line number #2 at the head of the stream as shown in FIG.

6B. In this case, The pipeline controlling unit 212 stops supplying the instruction code to the second instruction pipeline 206 according to the detection of the instruction corresponding to this flag code. In this way, the second instruction pipeline 206 holds the instruction stream corresponding to the instruction codes of the line numbers #2 to #5 as the condition non-satisfaction instruction stream.

Figure 6C:
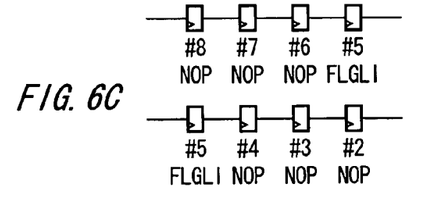

Then, after the first instruction pipeline 204 outputs the instructions corresponding to the line numbers #2 to #4 to the test pattern outputting unit 210, the first instruction pipeline 204 updates the storage instruction stream to an instruction stream including an instruction corresponding to the conditional jump code of the line number #5 at the head of the stream as shown in FIG. 6C. In this way, the first instruction pipeline 204 stores the instruction stream corresponding to the instruction codes below the line number #6 as the condition satisfaction instruction stream.

Then, the deciding unit 50 performs the match detection task according to the instruction corresponding to the conditional jump code stored in the head of the first instruction pipeline 204. Then, when the decision result is a mismatch, the selection unit 208 exchanges a main pipeline and a sub pipeline with each other.

Figure 6D:
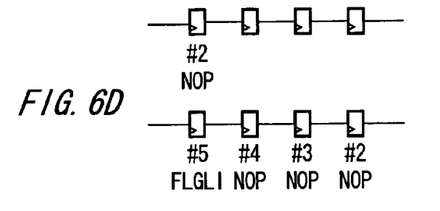

In this case, as shown in FIG. 6D, the first instruction pipeline 204 that is a new sub pipeline sequentially receives the instruction codes below the line number #2 after destroying the storage instruction stream in order to newly store the same instruction stream as the storage instruction stream of the second instruction pipeline 206 that is a new main pipeline. In this way, the first instruction pipeline 204 repacks the storage instruction stream.

Figure 6E:
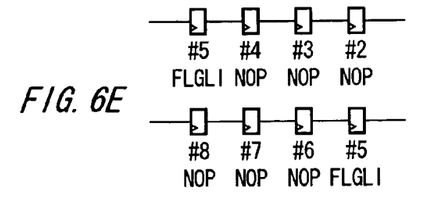

According to the similar operations to operations of the second instruction pipeline 206 and the first instruction pipeline 204 described using FIGS. 6B and 6C, the first instruction pipeline 204 holds the condition non-satisfaction instruction stream and the second instruction pipeline 206 stores the condition satisfaction instruction stream as shown in FIG. 6E.

Then, the deciding unit 50 performs the match detection task according to an instruction corresponding to the conditional jump code stored in the head of the second instruction pipeline 206, and the selection unit 208 exchanges a main pipeline and a sub pipeline with each other when the decision result is a mismatch.

Figure 6F:
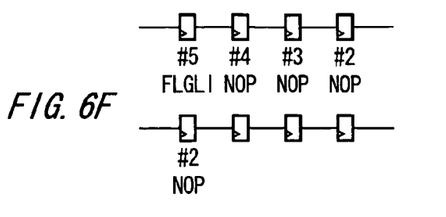
Figure 6G:
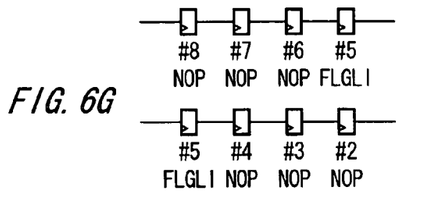

According to the similar operation to operation of the first instruction pipeline 204 described using FIG. 6D, the second instruction pipeline 206 that is a new sub pipeline repacks the storage instruction stream as shown in FIG. 6F and the first instruction pipeline 204 and the second instruction pipeline 206 have the same states as those shown in FIG. 6C, as shown in FIG. 6G.

Figure 6H:
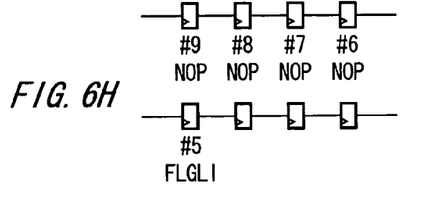

Then, when the decision result is a match, as shown in FIG. 6H, the second instruction pipeline 206 destroys the held condition non-satisfaction instruction stream, and then newly stores the same instruction stream as the storage instruction stream of the first instruction pipeline 204.

Figure 6I:
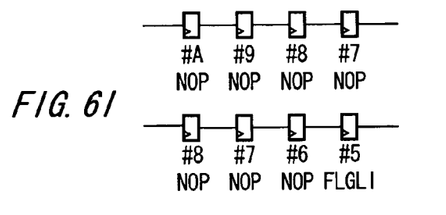

In addition, while the second instruction pipeline 206 sequentially is receiving the instruction codes to store a new storage instruction stream, the first instruction pipeline 204 may receive the other instruction codes from the instruction storing memory 202 to update the storage instruction stream as shown in FIG. 6I.

Figure 6J:
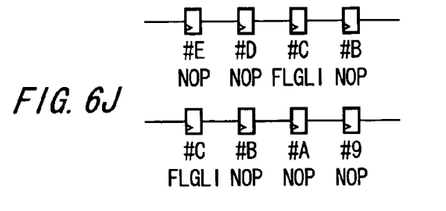

Then, as shown in FIG. 6J, the second instruction pipeline 206 holds the instruction stream corresponding to the instruction codes of the line numbers #9 to #C as the condition non-satisfaction instruction stream when generating the instruction corresponding to the flag code of the line number #9 at the head of the storage instruction stream.

Figure 7A:
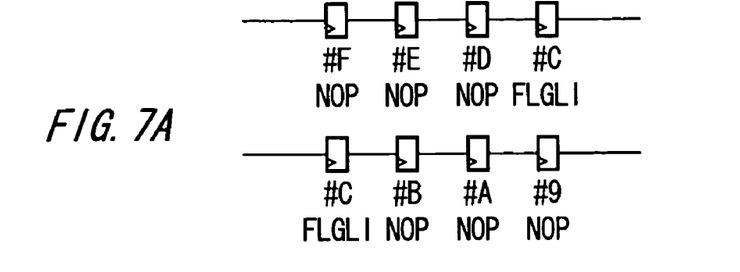
FIGS. 7A to 7D are views exemplary explaining operations of the first instruction pipeline and the second instruction pipeline.

Then, the first instruction pipeline 204 updates the storage instruction stream to an instruction stream including an instruction corresponding to the conditional jump code of the line number #C at the head of the stream and stores an instruction stream corresponding to the instruction codes below the line number #D as the condition satisfaction instruction stream as shown in FIG. 7A. The deciding unit 50 performs the match detection task according to the instruction corresponding to this conditional jump code.

Figure 7B:
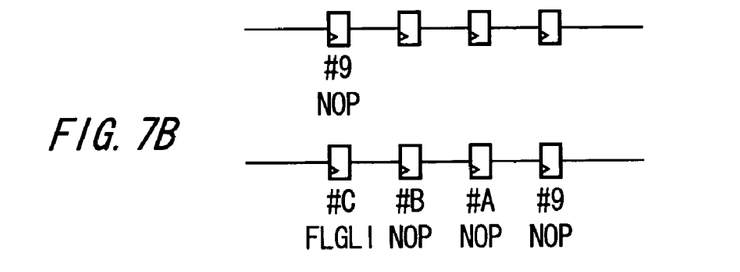

Here, when the decision result is a mismatch, the selection unit 208 exchanges a main pipeline and a sub pipeline with each other. Then, as shown in FIG. 7B, the first instruction pipeline 204 that is a new sub pipeline repacks the storage instruction stream with the same instruction stream as the storage instruction stream of the second instruction pipeline 206 that is a new main pipeline.

Figure 7C:
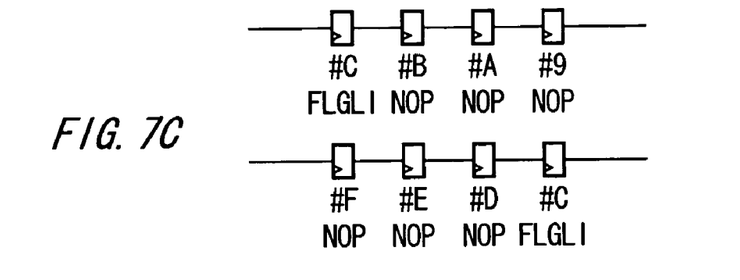

Then, the first instruction pipeline 204 holds the condition non-satisfaction instruction stream corresponding to the instruction codes of the line numbers #9 to #C and the second instruction pipeline 206 stores the condition satisfaction instruction stream corresponding to the instruction codes below the line number #D as shown in FIG. 7C. The deciding unit 50 performs the match detection task.

Figure 7D:
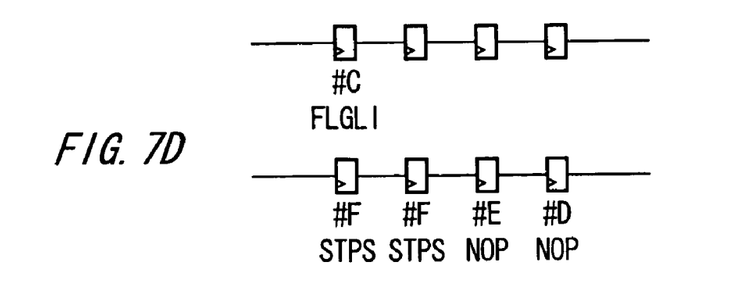

Here, when the decision result is a match, the first instruction pipeline 204 repacks the storage instruction stream and the second instruction pipeline 206 sequentially outputs the instructions corresponding to the line numbers #D to #F. In this case, the testing device 100 terminates an operation according to an end code STPS of the line number #F, as shown in FIG. 7D.

Figure 8:
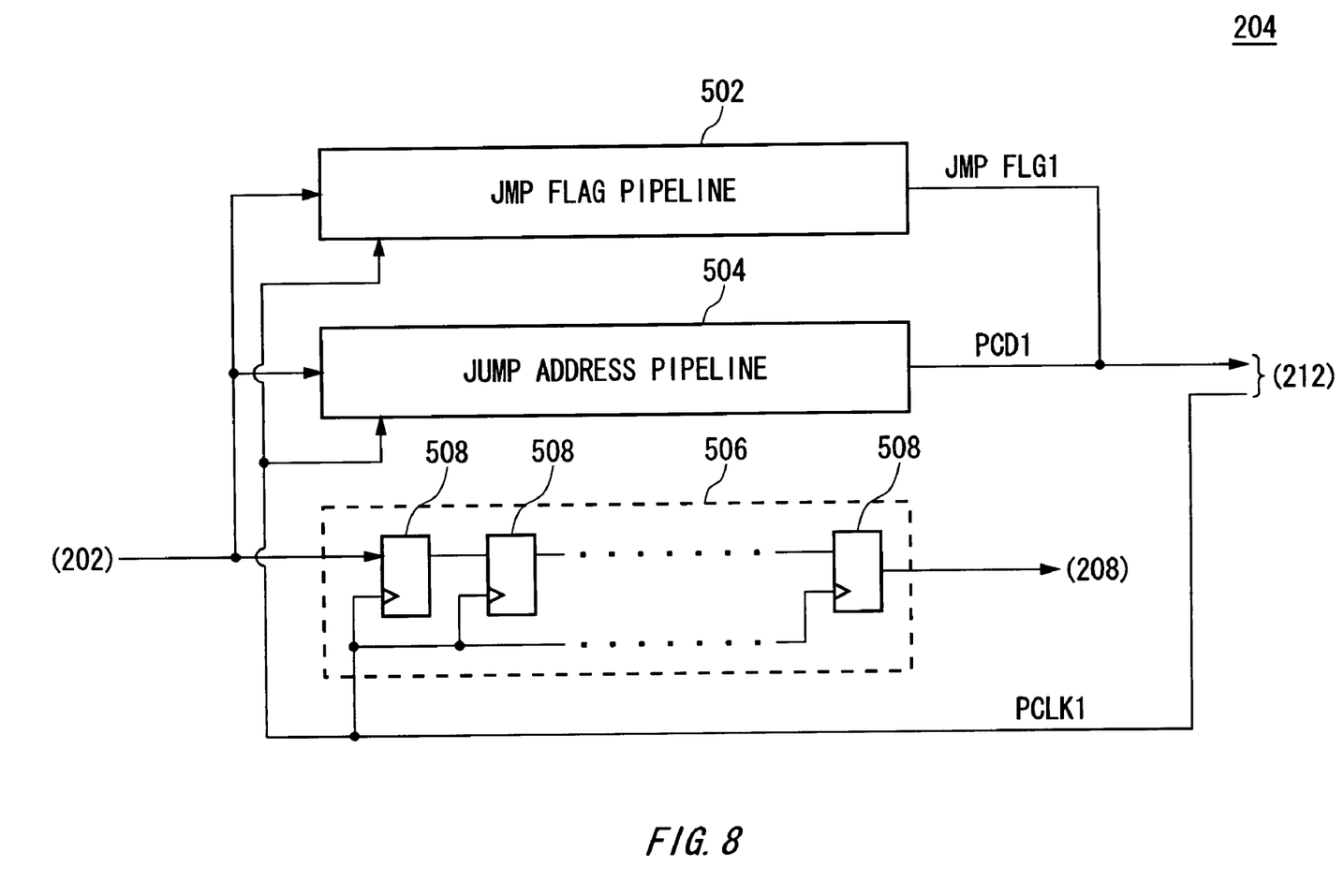
FIG. 8 is a view exemplary showing a configuration of the first instruction pipeline.

FIG. 8 is a view exemplary showing a configuration of the first instruction pipeline 204. The first instruction pipeline 204 has an instruction code pipeline 506, a JMP flag pipeline 502, and a jump address pipeline 504.

Each of the instruction code pipeline 506, the JMP flag pipeline 502, and the jump address pipeline 504 sequentially receives the instruction codes from the instruction storing memory 202 to sequentially update information to be stored according to a pipeline clock PCLK1 received from the pipeline controlling unit 212.

The instruction code pipeline 506 includes a plurality of registers 508 that is respectively provided corresponding to a plurality of instructions included in the storage instruction stream. The plurality of registers 508 respectively stores the corresponding instructions, and supplies the stored instructions to the register 508 of the next stage according to the pipeline clock PCLK1. Moreover, the register 508 of the first stage stores an instruction corresponding to the instruction code as the final instruction of the storage instruction stream based on the instruction code received from the instruction storing memory 202. In addition, the register 508 of the first stage may receive, e.g., an instruction generated by decoding the instruction code to store it.

Moreover, the register 508 of the final stage stores a head instruction in the storage instruction stream, and supplies the instruction to the selection unit 208 according to the pipeline clock PCLK1. According to this example, the first instruction pipeline 204 can adequately update the storage instruction stream based on the instruction codes sequentially received from the instruction storing memory 202.

The JMP flag pipeline 502 stores information showing whether each instruction in the storage instruction stream is the flag code based on the instruction code received from the instruction storing memory 202. Moreover, the JMP flag pipeline 502 supplies information (JMP FLG1), which shows whether the head instruction in the storage instruction stream is the flag code, to the pipeline controlling unit 212.

The jump address pipeline 504 stores the program counter value of the instruction code corresponding to the next instruction according to each instruction in the storage instruction stream based on the instruction code received from the instruction storing memory 202. Moreover, the jump address pipeline 504 supplies a storage counter data (PCD1), which is a program counter value stored corresponding to the head instruction in the storage instruction stream, to the pipeline controlling unit 212.

In addition, each of the JMP flag pipeline 502 and the jump address pipeline 504 has the same or similar configuration as or to that of the instruction code pipeline 506. In this example, each of the JMP flag pipeline 502 and the jump address pipeline 504 has the number of stages same as that of the instruction code pipeline 506.

Moreover, the second instruction pipeline 206 (see FIG. 3) outputs flag information (JMP FLG2) in place of the flag information (JMP FLG1) and outputs a storage counter data (PCD2) in place of the storage counter data (PCD1). For the rest, the second instruction pipeline 206 has the same or similar function and configuration as or to those of the first instruction pipeline 204.

Figure 9:
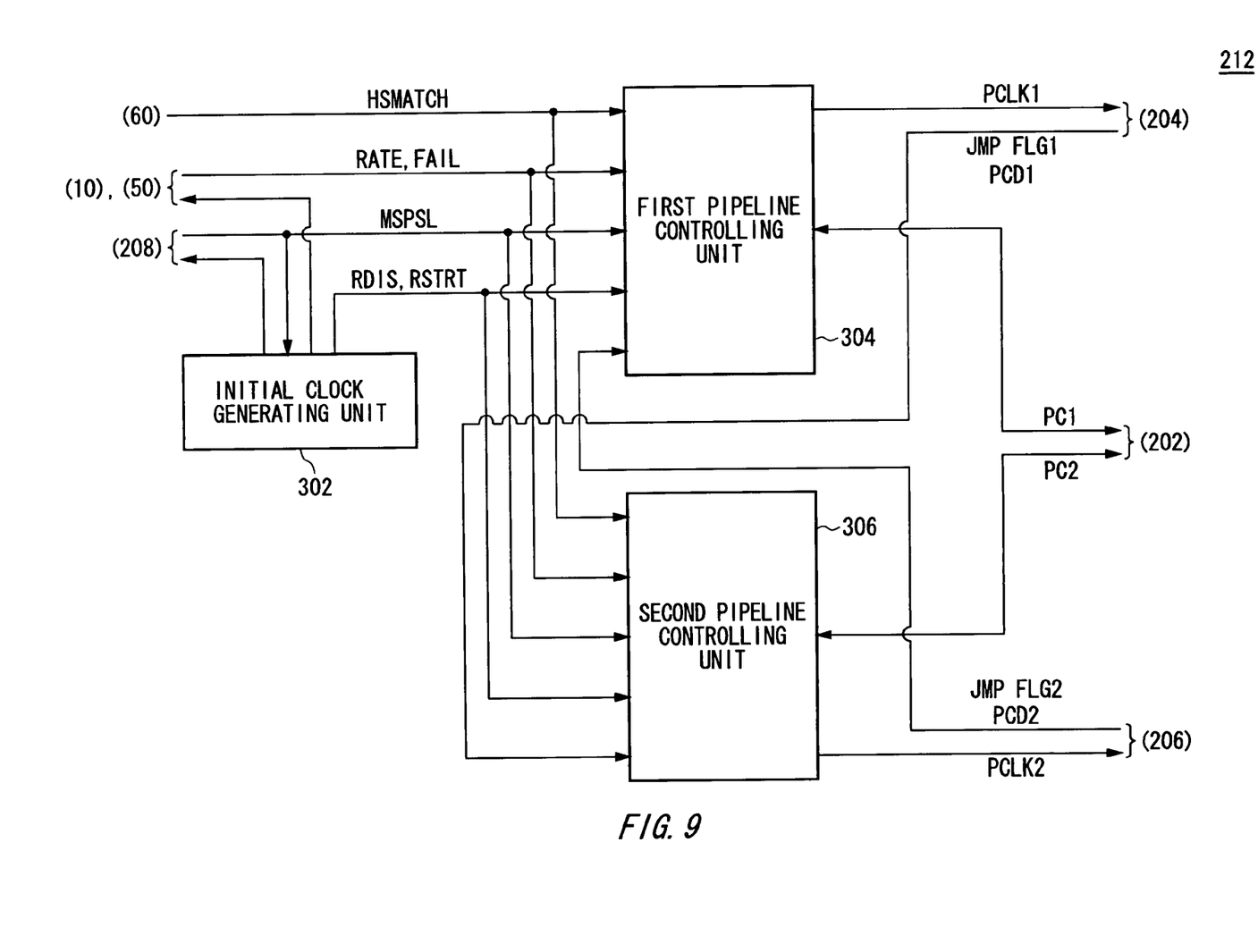
FIG. 9 is a view exemplary showing a configuration of a pipeline controlling unit.

FIG. 9 is a view exemplary showing a configuration of the pipeline controlling unit 212. The pipeline controlling unit 212 has an initial clock generating unit 302, a first pipeline controlling unit 304, and a second pipeline controlling unit 306.

The initial clock generating unit 302 supplies a control signal RDIS based on a selection signal MSPSL received from the selection unit 208 to the first pipeline controlling unit 304 and the second pipeline controlling unit 306 in order to control these units. Moreover, the initial clock generating unit 302 supplies a high clock RSTART having higher frequency than the cycle clock RATE to the first pipeline controlling unit 304 and the second pipeline controlling unit 306 and supplies the start signal START to the selection unit 208.

The first pipeline controlling unit 304 outputs the pipeline clock PCLK1 based on the match test instructing signal HSMATCH, the cycle clock RATE, the fail signal FAIL, the selection signal MSPSL, the control signal RDIS, and the high clock RSTART. For example, when the pipeline controlling unit 212 supplies the instruction codes to the main pipeline, the first pipeline controlling unit 304 outputs the cycle clock RATE as the pipeline clock PCLK1.

Moreover, the first pipeline controlling unit 304 supplies the program counter value PC1 to the instruction storing memory 202. The first pipeline controlling unit 304 sequentially changes the program counter value PC1 according to the cycle clock RATE.

Here, the first pipeline controlling unit 304 decides whether the head instruction of the storage instruction stream is the flag code based on the flag information (JMP FLG2) received from the second instruction pipeline 206. Then, when the head instruction is the flag code, the first pipeline controlling unit 304 stops outputting the pipeline clock PCLK1. In this way, the pipeline controlling unit 212 stops supplying the instruction codes to the first instruction pipeline 204.

Moreover, when the first instruction pipeline 204 destroys the storage instruction stream, the first pipeline controlling unit 304 repacks the first instruction pipeline 204 based on the storage counter data (PCD2) received from the second instruction pipeline 206. In this case, the first pipeline controlling unit 304 uses the second instruction pipeline 206 as a reservation register that stores the program counter value corresponding to the instruction code to be supplied to the first instruction pipeline 204. The first pipeline controlling unit 304 changes the value of the program counter value PC1 to be output based on the storage counter data (PCD2).

Here, when repacking the first instruction pipeline 204, the first pipeline controlling unit 304 outputs the high clock RSTART as the pipeline clock PCLK1. In this case, it is possible to repack the first instruction pipeline 204 at high speed.

The second pipeline controlling unit 306 receives the flag information (JMP FLG1) and the storage counter data (PCD1) from the first instruction pipeline 204 in place of the flag information (JMP FLG2) and the storage counter data (PCD2), and outputs the pipeline clock PCLK2 in place of the pipeline clock PCLK1. For the rest, since the second pipeline controlling unit 306 has the same or similar function and configuration as or to those of the first pipeline controlling unit 304, their descriptions will be omitted. According to this example, it possible to adequately control the first instruction pipeline 204 and the second instruction pipeline 206.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

INDUSTRIAL APPLICABILITY

As apparent from the above descriptions, according to the present invention, it is possible to provide a testing device that tests an electronic device at high speed.

What is claimed is:

1. A testing device that tests an electronic device, comprising:
   a test pattern outputting unit operable to output a test pattern to the electronic device;
   a deciding unit operable to decide whether an output signal from the electronic device satisfies a predetermined condition;
   an instruction storing unit operable to store a plurality of instruction codes to be used for a test of the electronic device;
   a first instruction pipeline operable to generate a condition satisfaction instruction stream including a plurality of instructions that causes said test pattern outputting unit to output the test pattern to be supplied to the electronic device when the output signal satisfies the condition based on the plurality of instruction codes sequentially received from said instruction storing unit;
   a second instruction pipeline operable to generate a condition non-satisfaction instruction stream including a plurality of instructions that causes said test pattern outputting unit to output the test pattern to be supplied to the electronic device when the output signal does not satisfy the condition based on the plurality of instruction codes sequentially received from said instruction storing unit; and
   a selection unit operable to select which of the condition satisfaction instruction stream or the condition non-satisfaction instruction stream is supplied to said test pattern outputting unit based on the result decided by said deciding unit.

2. The testing device as claimed in claim 1, wherein said deciding unit decides that the output signal satisfies the condition when the output signal is identical with a predetermined value.

3. The testing device as claimed in claim 1, wherein
when the output signal does not satisfy the condition,
said second instruction pipeline further generates a new condition satisfaction instruction stream after supplying the condition non-satisfaction instruction stream to said test pattern outputting unit,
said first instruction pipeline destroys the condition satisfaction instruction stream to newly generate a condition non-satisfaction instruction stream,
said deciding unit decides again whether the output signal satisfies the condition after said second instruction pipeline generates the condition satisfaction instruction stream, and
said selection unit selects again which of the condition satisfaction instruction stream or the condition non-satisfaction instruction stream is supplied to said test pattern outputting unit based on the result decided by said deciding unit.

4. The testing device as claimed in claim 1, wherein
said instruction storing unit stores a flag code that is the instruction code in association with a preset jump flag and a conditional jump code that is the instruction code causing said deciding unit to decide whether the output signal from the electronic device satisfies the condition and causing said test pattern outputting unit to execute the instruction corresponding to the flag code when the output signal does not satisfy the condition,
said second instruction pipeline generates instructions respectively corresponding to the flag code and the conditional jump code as the instructions at the head and end of the condition non-satisfaction instruction stream, and
said deciding unit performs the decision of the condition according to the conditional jump code.

5. The testing device as claimed in claim 4, wherein said second instruction pipeline stores a storage instruction stream including the instructions of a predetermined number generated by processing the plurality of instruction codes, sequentially updates the storage instruction stream based on the instruction codes sequentially output from said instruction storing unit, and holds at least a part of the storage instruction stream as the condition non-satisfaction instruction stream by stopping receiving the instruction codes when the instruction at the head of the updated storage instruction stream is the instruction corresponding to the flag code.

6. The testing device as claimed in claim 5, further comprising an instruction supplying unit operable to supply the instruction codes sequentially received from said instruction storing unit to both of said first instruction pipeline and said second instruction pipeline while said second instruction pipeline is receiving the instruction codes and also supply the instruction codes to said first instruction pipeline after said second instruction pipeline stops receiving the instruction codes.

7. The testing device as claimed in claim 1, wherein
said electronic device is a semiconductor memory,
said test pattern outputting unit outputs the test pattern performing writing or erasing with respect to a preset address of the semiconductor memory,
said deciding unit decides that the output signal satisfies the condition when the semiconductor memory outputs the output signal showing a completion of the writing or erasing,
said second instruction pipeline generates an instruction stream, which causes said test pattern outputting unit to output the test pattern performing the writing or erasing once more with respect to the preset address, as the condition non-satisfaction instruction stream, and
said selection unit causes said second instruction pipeline to output the condition non-satisfaction instruction stream in order to make said test pattern outputting unit perform the writing or erasing once more with respect to the preset address when said deciding unit decides that the output signal does not satisfy the condition.

8. The testing device as claimed in claim 7, wherein said first instruction pipeline generates an instruction stream, which causes said test pattern outputting unit to output the test pattern performing writing or erasing with respect to an address different from the preset address of the semiconductor memory, as the condition satisfaction instruction stream.

9. The testing device as claimed in claim 7, wherein
the testing device tests the plurality of semiconductor memories, and
said deciding unit decides that the output signal satisfies the condition when all the semiconductor memories output the output signal showing a completion of the writing or erasing.

10. The testing device as claimed in claim 7, wherein said semiconductor memory is a flash memory.

* * * * *